(12) United States Patent
Lim et al.

(10) Patent No.: US 11,329,097 B2
(45) Date of Patent: May 10, 2022

(54) SEMICONDUCTOR DEVICE HAVING A FIRST PAD NOT OVERLAPPING FIRST CONNECTION ELECTRODES AND A SECOND PAD NOT OVERLAPPING SECOND CONNECTION ELECTRODES IN A THICKNESS DIRECTION

(71) Applicant: SUZHOU LEKIN SEMICONDUCTOR CO., LTD., Taicang (CN)

(72) Inventors: Woo Sik Lim, Seoul (KR); Jae Won Seo, Seoul (KR); Jin Kyung Choi, Seoul (KR); Youn Joon Sung, Seoul (KR); Jong Hyun Kim, Seoul (KR); Hoe Jun Kim, Seoul (KR)

(73) Assignee: SUZHOU LEKIN SEMICONDUCTOR CO., LTD., Suzhou (CN)

( * ) Notice: Subject to any disclaimer, the term of this patent is extended or adjusted under 35 U.S.C. 154(b) by 256 days.

(21) Appl. No.: 16/497,835

(22) PCT Filed: Mar. 27, 2018

(86) PCT No.: PCT/KR2018/003620
§ 371 (c)(1),
(2) Date: Sep. 26, 2019

(87) PCT Pub. No.: WO2018/182299
PCT Pub. Date: Oct. 4, 2018

(65) Prior Publication Data
US 2020/0105825 A1    Apr. 2, 2020

(30) Foreign Application Priority Data

Mar. 27, 2017 (KR) .................. 10-2017-0038605
Mar. 27, 2017 (KR) .................. 10-2017-0038606

(51) Int. Cl.
*H01L 27/15* (2006.01)
*H01L 33/38* (2010.01)
(Continued)

(52) U.S. Cl.
CPC ............ *H01L 27/156* (2013.01); *H01L 33/38* (2013.01); *H01L 33/62* (2013.01); *H01L 33/06* (2013.01);
(Continued)

(58) Field of Classification Search
CPC ....... H01L 27/156; H01L 33/38; H01L 33/62; H01L 33/06; H01L 33/32; H01L 33/40; H01L 33/46
(Continued)

(56) References Cited

U.S. PATENT DOCUMENTS

| 2008/0087902 A1 | 4/2008 | Lee et al. |
| 2012/0056217 A1 | 3/2012 | Jung et al. |

(Continued)

FOREIGN PATENT DOCUMENTS

| JP | 2009-182357 | 8/2009 |
| KR | 10-2006-0087620 | 8/2006 |

(Continued)

OTHER PUBLICATIONS

International Search Report dated Jul. 3, 2018 issued in Application No. PCT/KR2018/003620.
(Continued)

*Primary Examiner* — Xia L Cross
(74) *Attorney, Agent, or Firm* — Birch, Stewart, Kolasch & Birch, LLP

(57) ABSTRACT

An embodiment provides a semiconductor device including a light-emitting structure including a plurality of light-emitting portions disposed at a side and a plurality of second light-emitting portions disposed at another side, a plurality
(Continued)

of first connection electrodes configured to electrically connect the plurality of first light-emitting portions, a plurality of second connection electrodes configured to electrically connect the plurality of second light-emitting portions, a first pad disposed on the plurality of first light-emitting portions, and a second pad disposed on the plurality of second light-emitting portions. The first pad includes a plurality of 1-2 pads extending toward the second pad. The second pad includes a plurality of 2-2 pads extending toward the first pad. The first connection electrode includes a region between the plurality of 1-2 pads in a thickness direction of the light-emitting structure. The second connection electrode includes a region between the plurality of 2-2 pads in the thickness direction of the light-emitting structure.

18 Claims, 9 Drawing Sheets

(51) Int. Cl.
 *H01L 33/62* (2010.01)
 *H01L 33/06* (2010.01)
 *H01L 33/32* (2010.01)
 *H01L 33/40* (2010.01)
 *H01L 33/46* (2010.01)

(52) U.S. Cl.
 CPC .............. *H01L 33/32* (2013.01); *H01L 33/40* (2013.01); *H01L 33/46* (2013.01)

(58) Field of Classification Search
 USPC .......................................................... 257/88
 See application file for complete search history.

(56) References Cited

U.S. PATENT DOCUMENTS

| | | | |
|---|---|---|---|
| 2016/0240759 A1 | 8/2016 | Chae et al. | |
| 2017/0229482 A1* | 8/2017 | Chen | ..................... H01L 25/167 |
| 2017/0331021 A1* | 11/2017 | Chae | ...................... H01L 33/36 |

FOREIGN PATENT DOCUMENTS

| | | |
|---|---|---|
| KR | 10-2011-0002907 | 1/2011 |
| KR | 10-2012-0047390 | 5/2012 |
| KR | 10-2012-0111960 A | 10/2012 |
| KR | 10-2013-0054034 A | 5/2013 |
| KR | 10-2015-0139194 A | 12/2015 |
| KR | 10-2016-0026705 A | 3/2016 |
| KR | 10-2016-0027875 | 3/2016 |
| KR | 10-2017-0011138 A | 2/2017 |
| KR | 10-2017-0016630 A | 2/2017 |

OTHER PUBLICATIONS

Korean Decision to Grant a Patent for Korean Application No. 10-2017-0038606, dated Sep. 16, 2021.

\* cited by examiner

[FIG. 1]
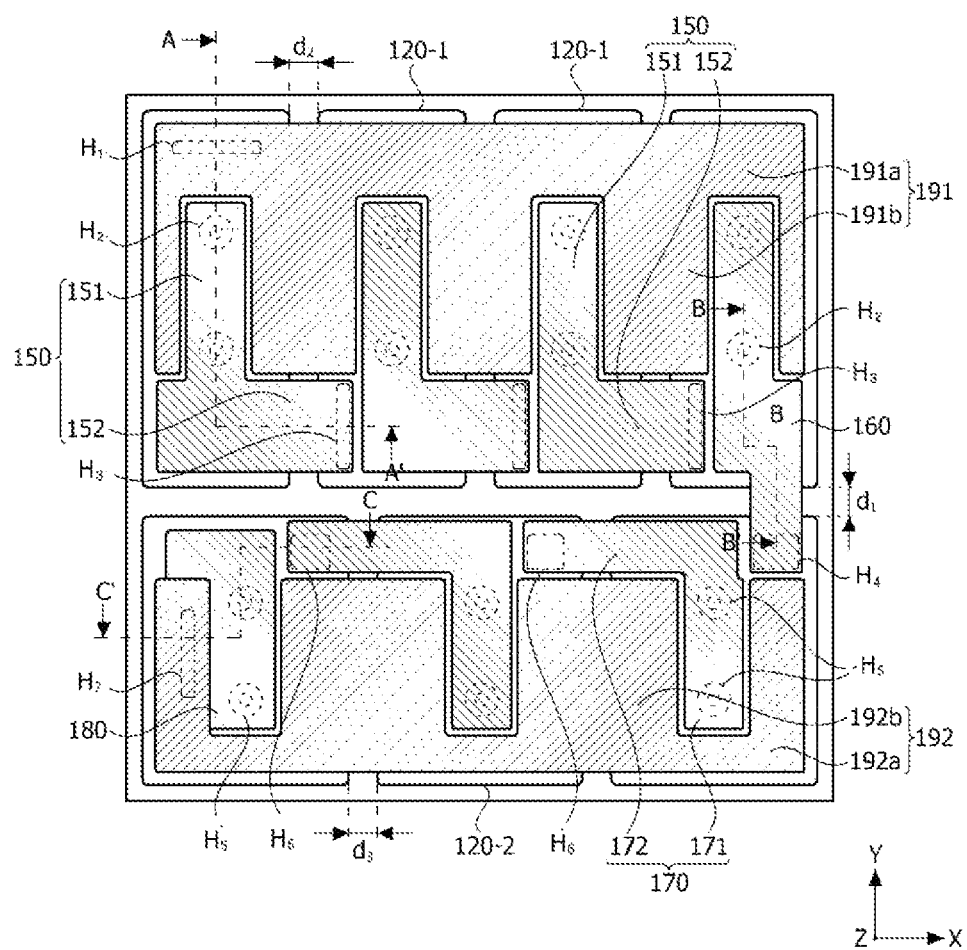
[FIG. 2]
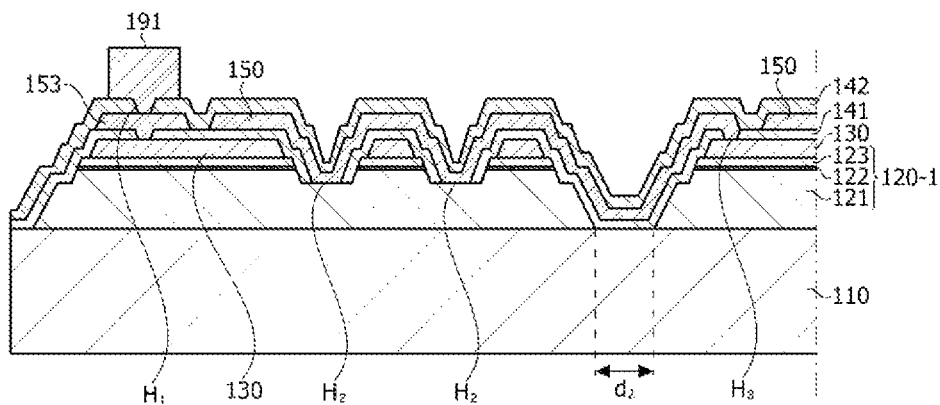

[FIG. 3]
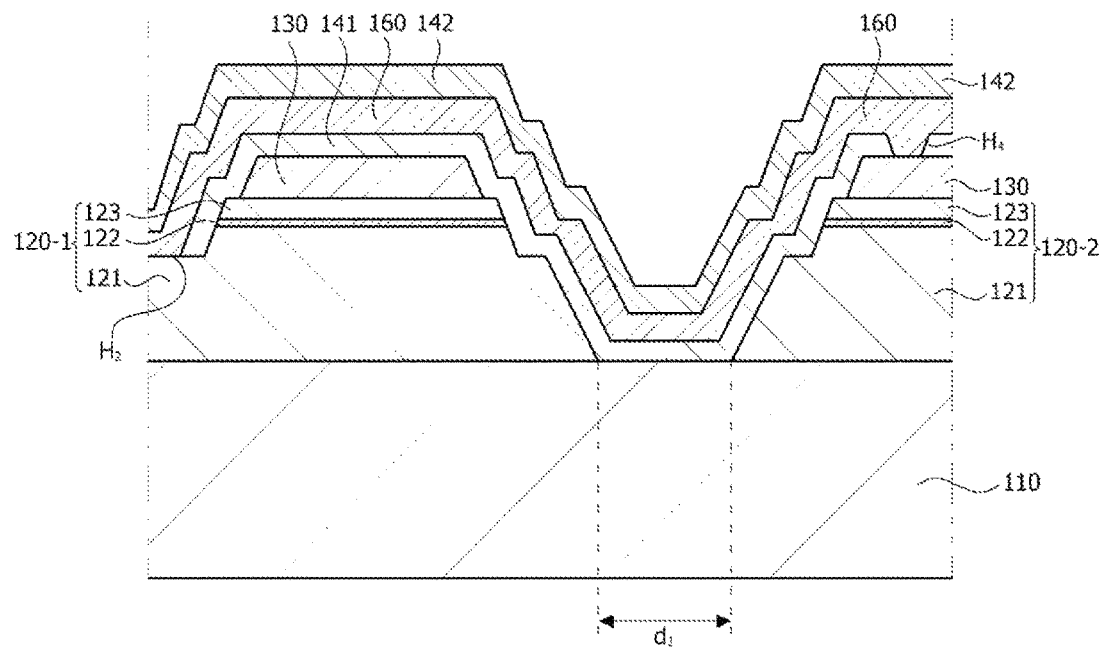
[FIG. 4]
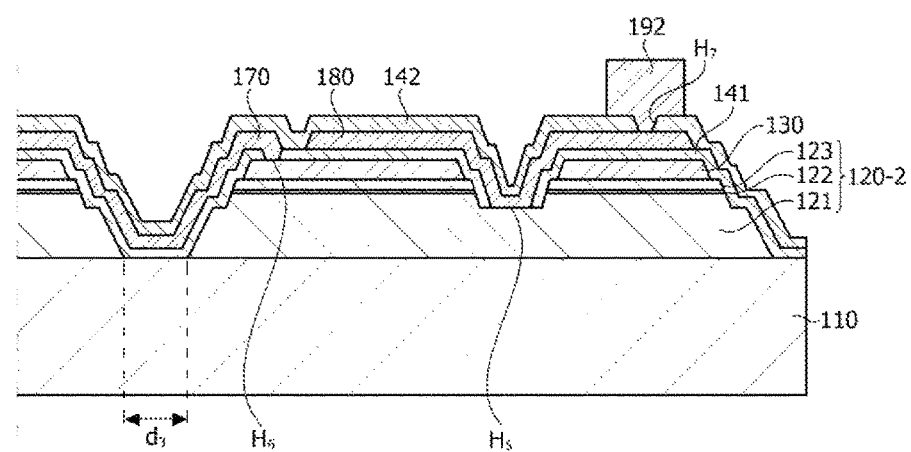

[FIG. 5]
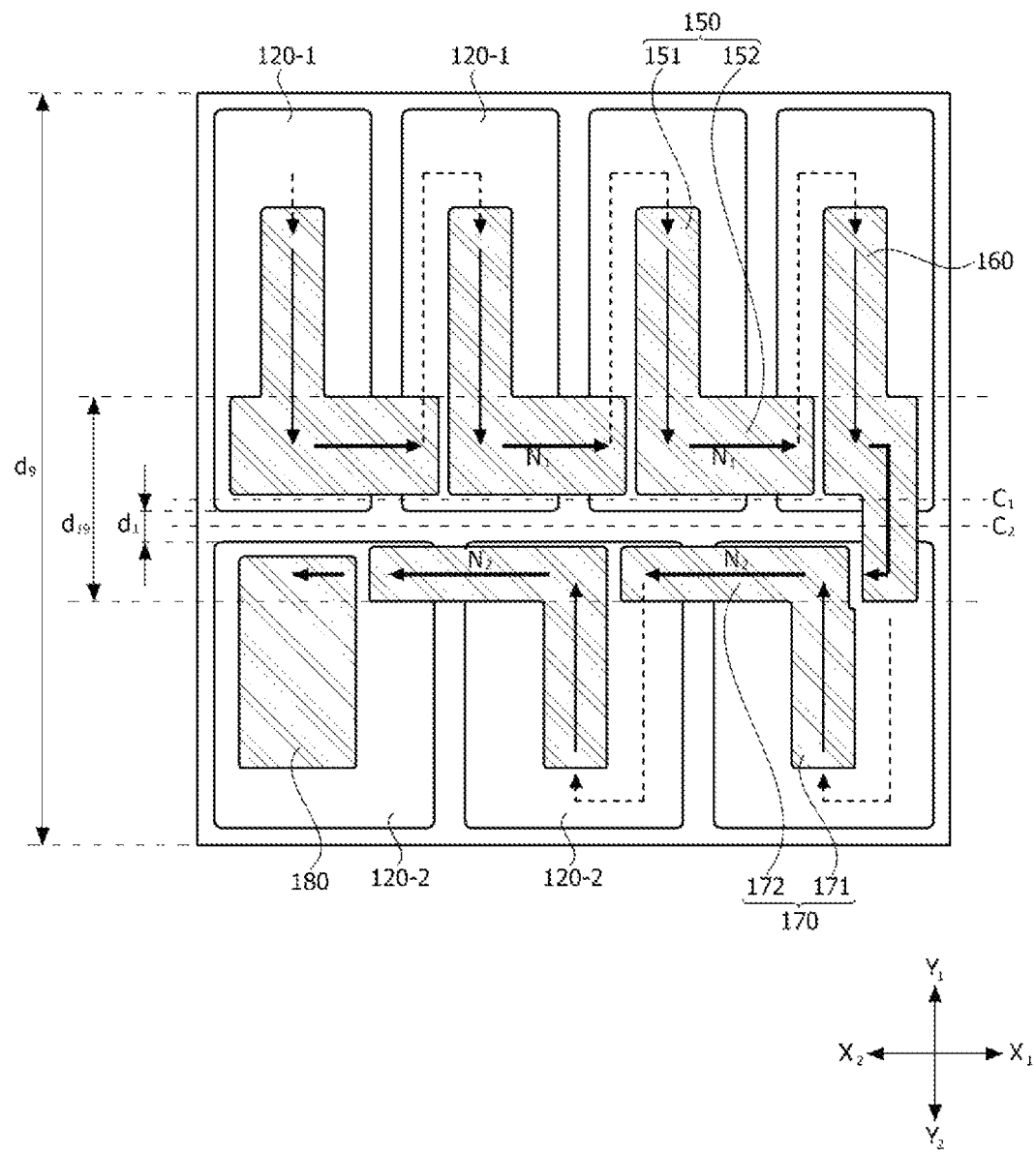

[FIG. 6]
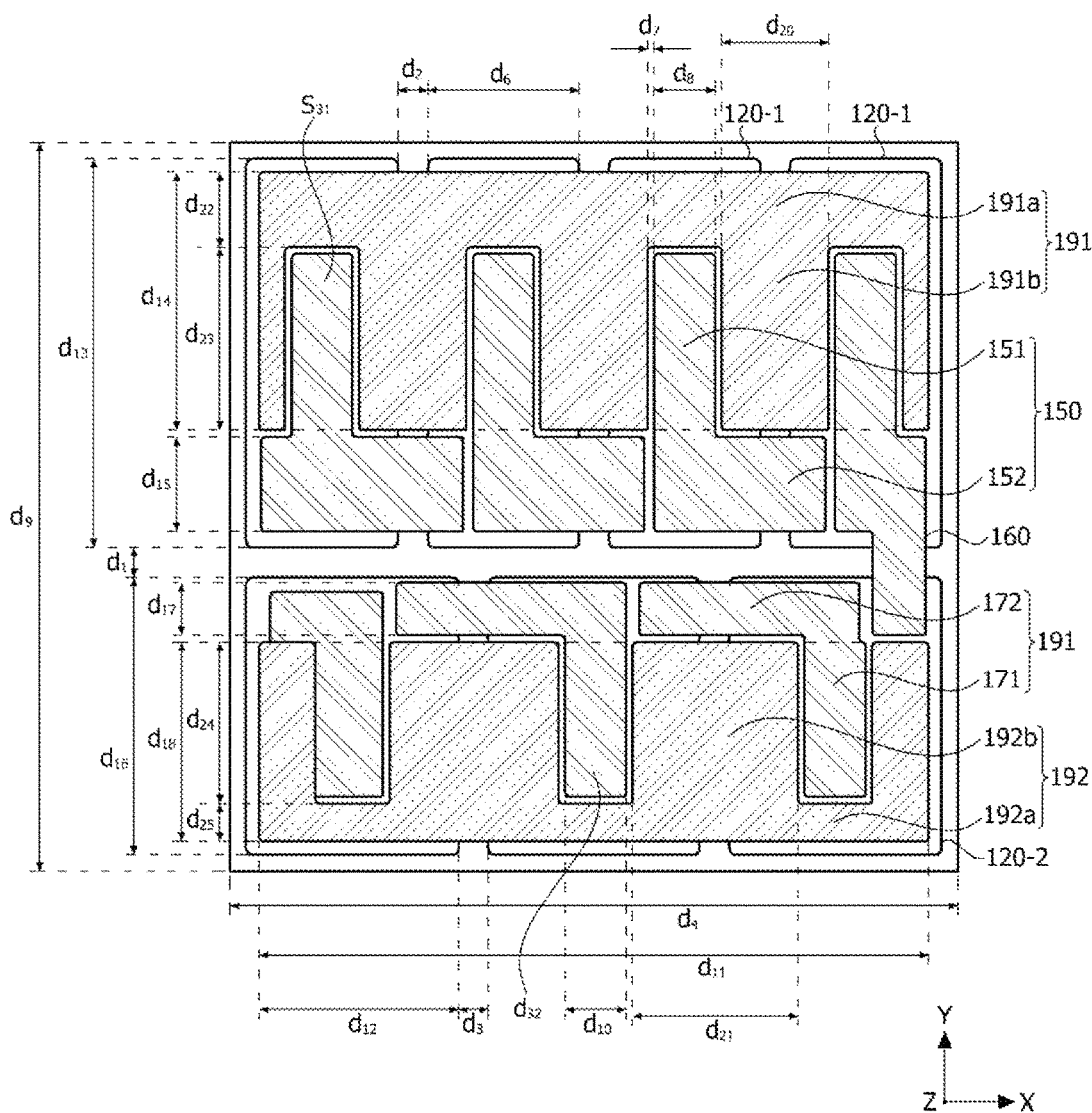

[FIG. 7]
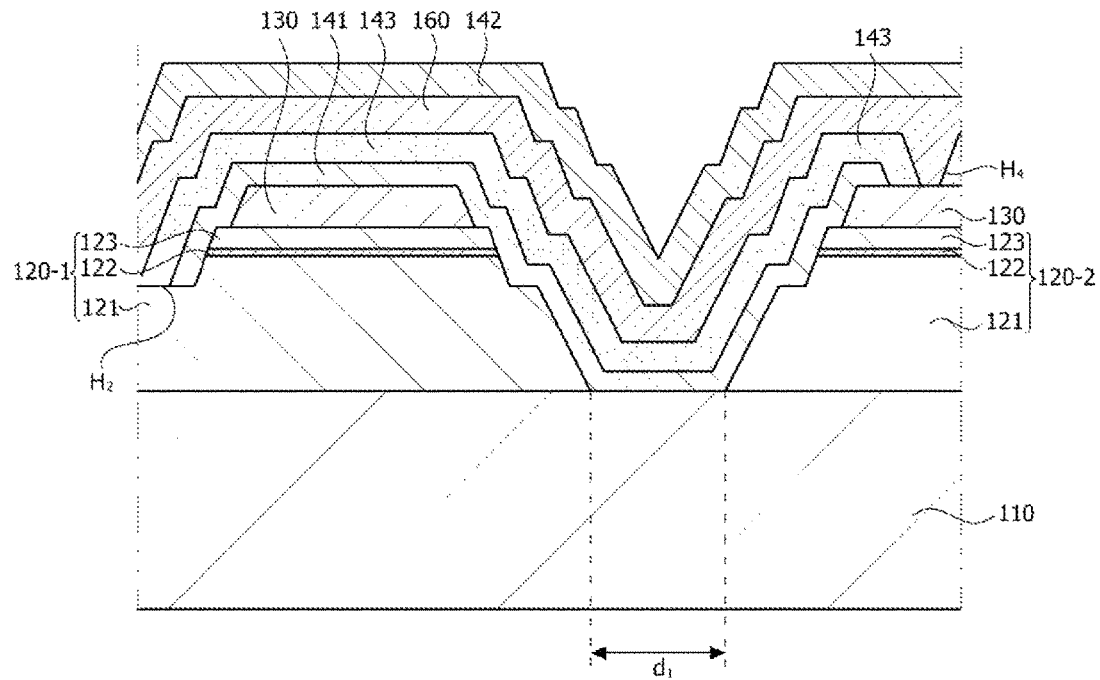
[FIG. 8]
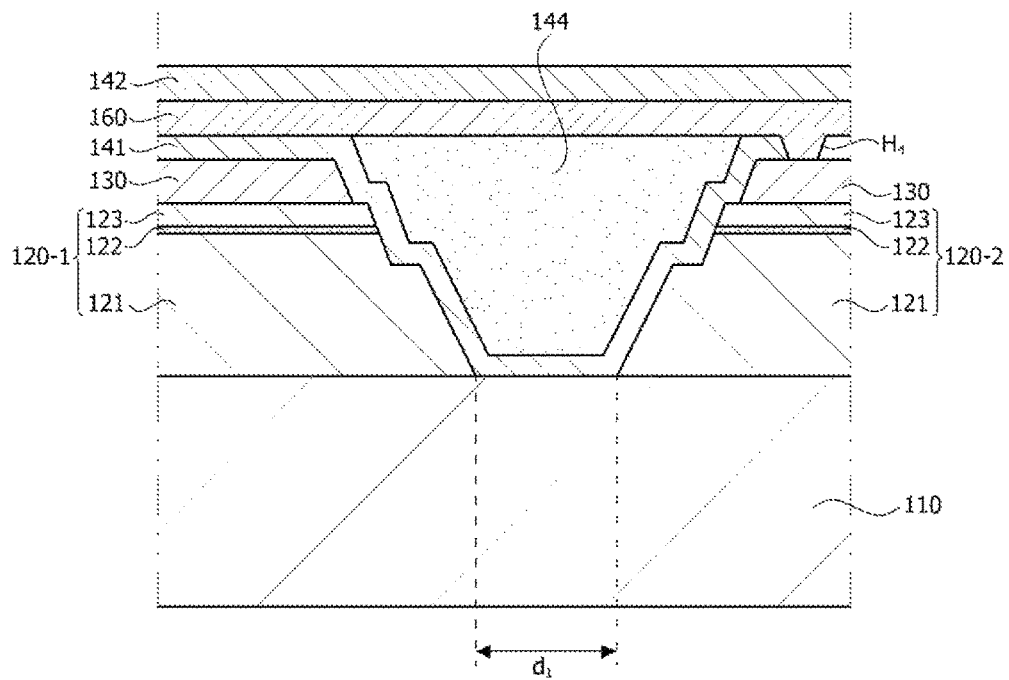

[FIG. 9]
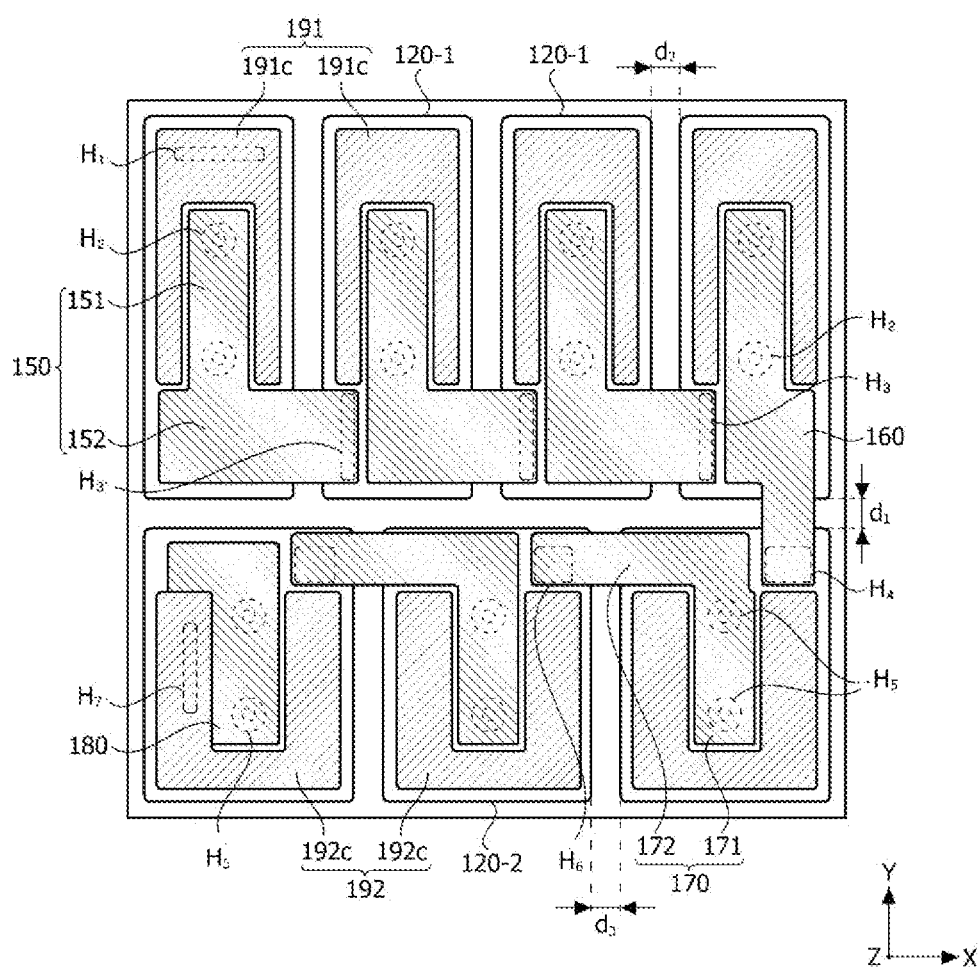

【FIG. 10】
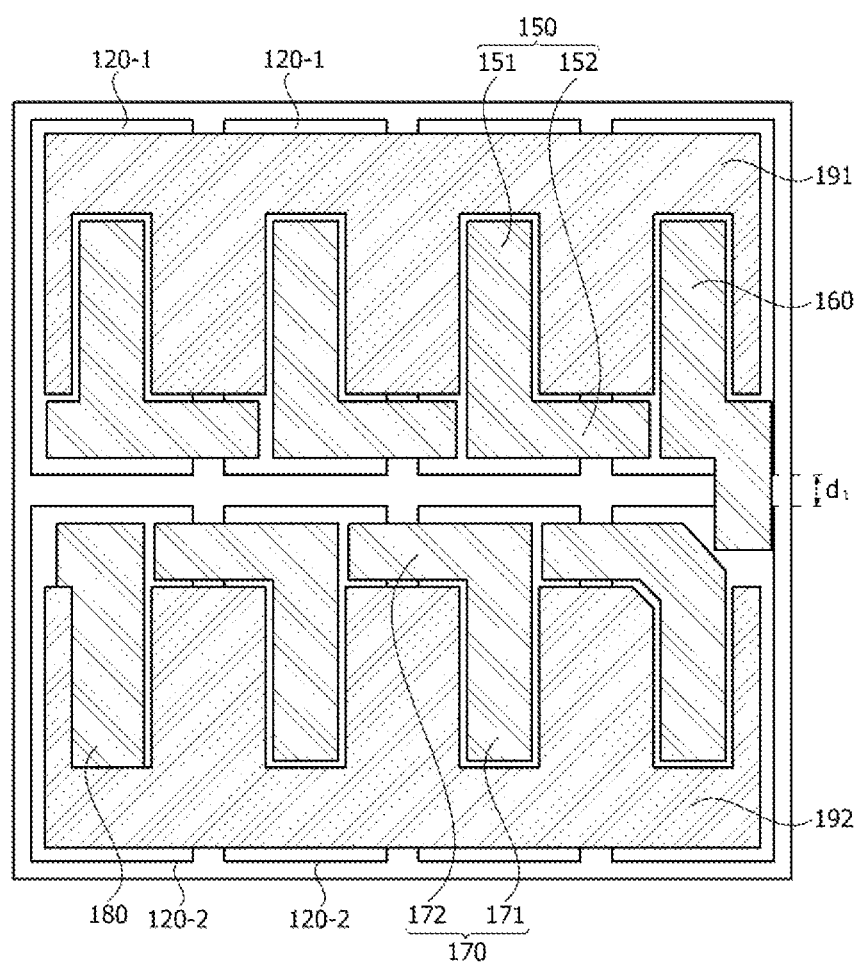

[FIG. 11]
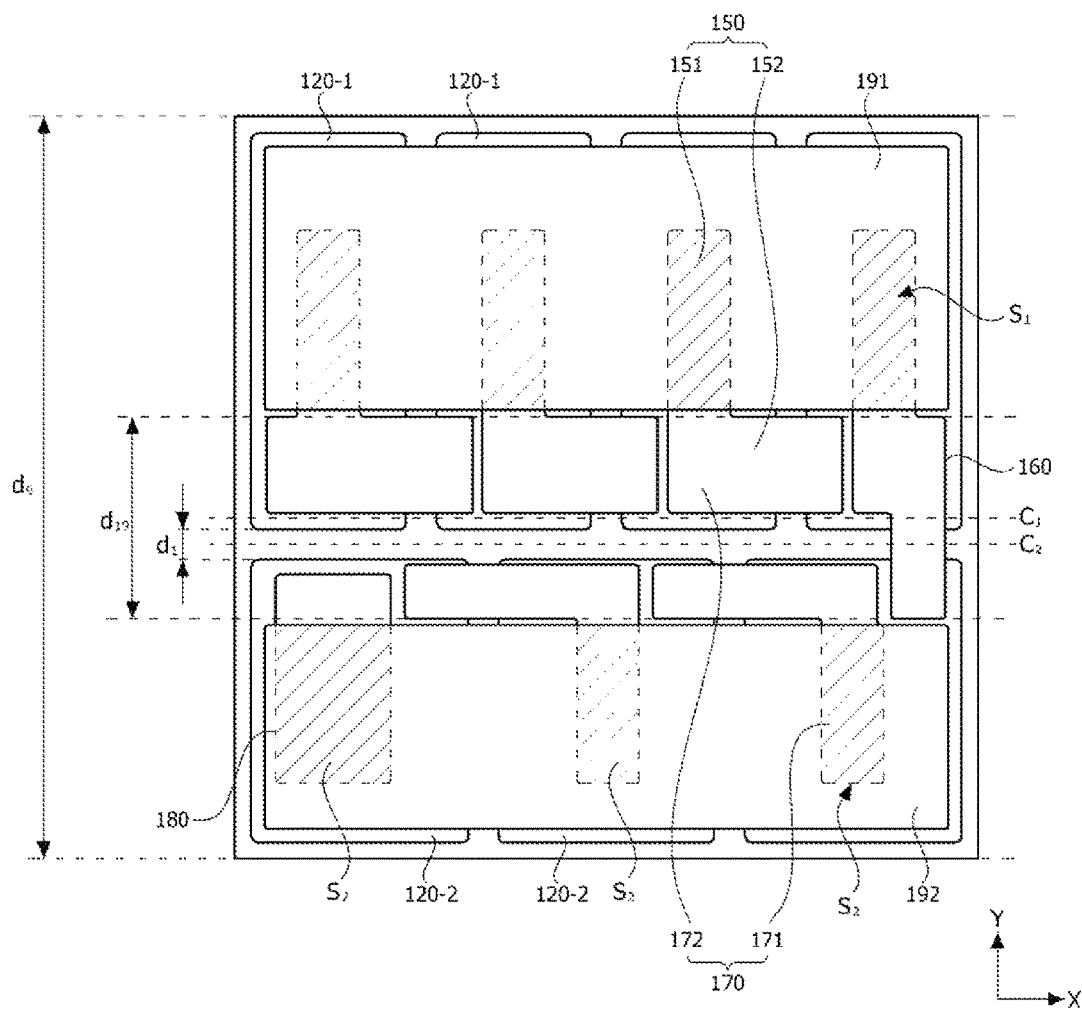

【FIG. 12】
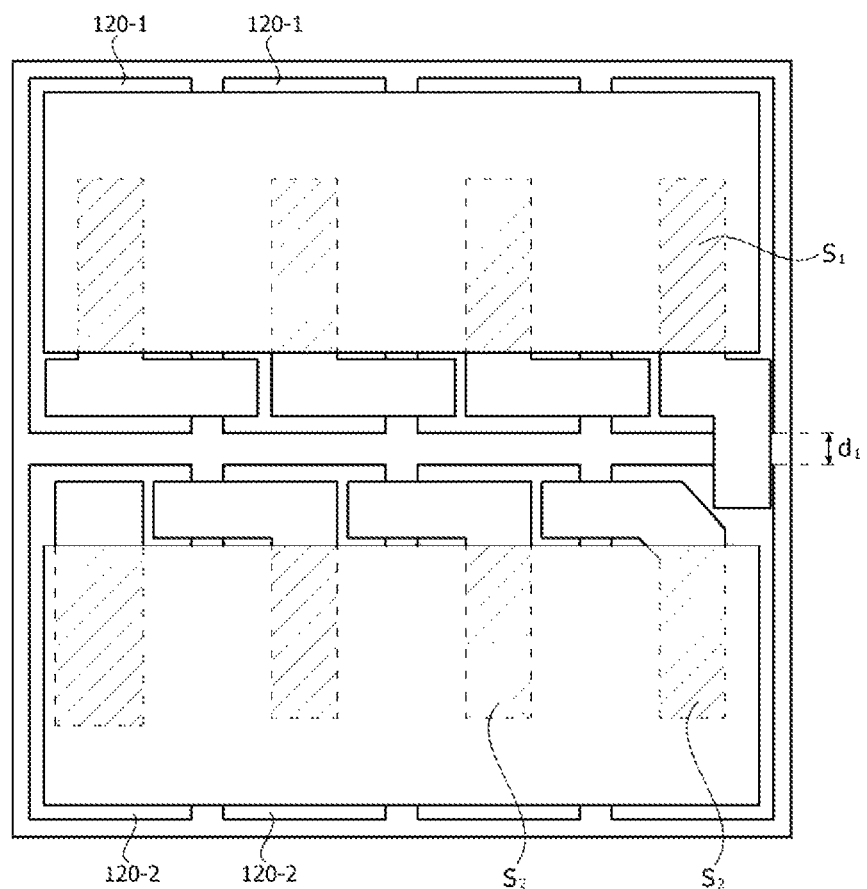

SEMICONDUCTOR DEVICE HAVING A FIRST PAD NOT OVERLAPPING FIRST CONNECTION ELECTRODES AND A SECOND PAD NOT OVERLAPPING SECOND CONNECTION ELECTRODES IN A THICKNESS DIRECTION

CROSS REFERENCE TO RELATED APPLICATIONS

This application is a U.S. National Stage Application under 35 U.S.C. § 371 of PCT Application No. PCT/KR2018/003620, filed Mar. 27, 2018, which claims priority to Korean Patent Application Nos. 10-2017-0038605 and 10-2017-0038606, filed Mar. 27, 2017, whose entire disclosures are hereby incorporated by reference.

FIELD OF THE INVENTION

Embodiments relate to semiconductor devices.

BACKGROUND ART

Semiconductor devices which include compounds such as GaN and AlGaN have many advantages, e.g., wide and easily controllable bandgap energy, and thus have been variously used in the form of light-emitting devices, light-receiving devices and various diodes.

Particularly, light-emitting devices, such as a light-emitting diode or a laser diode using a Group III-V compound semiconductor material or a Group II-VI compound semiconductor material of a semiconductor, are capable of not only emitting various-color rays, such as red, green, blue and ultraviolet rays, owing to development of thin-film growth technology and element materials but also emitting high-efficient white light beams using fluorescent materials or combination of colors, and have advantages, e.g., low power consumption, semi-permanent lifetime, a quick response rate, safety, and environmental friendliness, compared to existing light sources such as fluorescent lamps and incandescent lamps.

Furthermore, when a light-receiving device such as a photodetector or a solar cell is manufactured using a Group III-V compound semiconductor material or a Group II-VI compound semiconductor material of a semiconductor, photocurrent may be generated by absorbing light of various wavelength regions owing to development of a device material so that light of various wavelength ranges ranging from gamma rays to radio wavelength regions may be used. In addition, the semiconductor devices have advantages, e.g., a quick response rate, safety, environmental friendliness and easy controllability of device materials, and thus are easily applicable to power control or microwave circuits or communication modules.

Accordingly, applications of the semiconductor devices have been expanded to a transmission module of optical communication means, a light-emitting diode backlight unit which may replace a cold cathode fluorescent lamp (CCFL) of a backlight unit of a liquid crystal display (LCD) device, a white light-emitting diode illumination device which may replace a fluorescent lamp or an incandescent lamp, headlights for vehicles, traffic lights, and sensors for sensing gas and fire. In addition, applications of semiconductor devices may be expanded to high-frequency application circuits, other power control devices, and communication modules.

In recent years, research is being conducted on semiconductor devices capable of being driven with high power by dividing a light-emitting structure into several parts.

SUMMARY OF THE INVENTION

Embodiments are directed to providing a semiconductor device with improved reliability at a high voltage.

Embodiments are also directed to providing a semiconductor device with improved current distribution efficiency.

Embodiments are also directed to providing a semiconductor device in which current densities of light-emitting regions are uniform.

One aspect of embodiments provides a semiconductor device including a light-emitting structure including a plurality of first light-emitting portions disposed at a side and a plurality of second light-emitting portions disposed at another side, a plurality of first connection electrodes configured to electrically connect the plurality of first light-emitting portions, a plurality of second connection electrodes configured to electrically connect the plurality of second light-emitting portions, a first pad disposed on the plurality of first light-emitting portions, and a second pad disposed on the plurality of second light-emitting portions. The first pad does not overlap the plurality of first connection electrodes in a thickness direction of the light-emitting structure. The second pad does not overlap the plurality of second connection electrodes in the thickness direction.

The plurality of first light-emitting portions may be spaced apart from each other in a first direction. The plurality of second light-emitting portions may be spaced apart from each other in the first direction. The plurality of first light-emitting portions may be spaced apart from the plurality of second light-emitting portions in a second direction perpendicular to the first direction.

The first pad may include a 1-1 pad extending in the first direction and disposed on the plurality of first light-emitting portions, and a 1-2 pad extending toward the second pad.

The first connection electrode may include a 1-1 connection electrode disposed on the first light-emitting portion; and a 1-2 connection electrode extending to the first light-emitting portion adjacent thereto.

The 1-1 connection electrode may be disposed between the adjacent 1-2 pads.

A ratio between a width of the first light-emitting portion in the second direction and a width of the 1-2 connection electrode in the second direction may be in a range of 1:0.15 to 1:0.35.

The second pad may include a 2-1 pad disposed on the plurality of second light-emitting portions, and a 2-2 pad extending from the 2-1 pad to the first pad.

A width of the 2-2 pad in the first direction may be greater than that of the 1-2 pad in the first direction, and a width of the 1-2 pad in the second direction may be greater than that of the 2-2 pad in the second direction.

The second connection electrode may include a 2-1 connection electrode disposed on the second light-emitting portion; and a 2-2 connection electrode extending to the second light-emitting portion adjacent thereto.

A width of the 1-2 connection electrode is greater than that of the 2-2 connection electrode.

A ratio between the width of the 1-2 connection electrode and the width of the 2-2 connection electrode is in a range of 1:0.4 to 1:0.7.

The light-emitting structure may include a pair of side surfaces parallel to the second direction, and a first imaginary line extending from a midpoint between the pair of side surfaces crosses the plurality of first light-emitting portions.

The number of the plurality of first light-emitting portions is greater than the number of second light-emitting portions.

A ratio between an area of the first light-emitting portion and an area of the second light-emitting portion may be in a range of 1:0.8 to 1:1.2.

The semiconductor device may further include a third connection electrode configured to electrically connect one of the plurality of first light-emitting portions and one of the plurality of second light-emitting portions.

The semiconductor device may further include a fourth connection electrode configured to electrically connect the second pad and the second light-emitting portion.

Another aspect of embodiments provides a semiconductor device including a light-emitting structure including a plurality of first light-emitting portions disposed at a side and a plurality of second light-emitting portions disposed at another side, a plurality of first connection electrodes configured to electrically connect the plurality of first light-emitting portions, a plurality of second connection electrodes configured to electrically connect the plurality of second light-emitting portions, a first pad disposed on the plurality of first light-emitting portions, and a second pad disposed on the plurality of second light-emitting portions. The first connection electrodes include a 2-2 connection electrode extending to the first light-emitting portion adjacent thereto. The second connection electrode includes a 2-2 connection electrode extending to the second light-emitting portion adjacent thereto. The light-emitting structure includes a first separation section disposed in a first direction and dividing the plurality of first light-emitting portions and the plurality of second light-emitting portions, and a first region extending from the first separation section in a second direction. The first region is a minimum region including the 1-2 connection electrode and the 2-2 connection electrode. The second direction is perpendicular to the first direction. A ratio between a maximum width of the semiconductor device in the second direction and a width of the first region in the second direction is in a range of 1:0.25 to 1:0.5.

Advantageous Effects

According to embodiments, a semiconductor device may be prevented from being broken at high voltage.

Furthermore, because a connection electrode and a pad are designed to avoid overlapping thereof, an insulating layer may be suppressed from being destroyed due to thermal stress when high voltage is applied thereto, thereby fixing a problem that some cells are not turned on.

In addition, current density of each light-emitting region may be uniform.

Various and beneficial advantages and effects of the present invention are not limited to the above description and will be more easily understood in the course of describing embodiments of the present invention in detail.

BRIEF DESCRIPTION OF THE DRAWINGS

FIG. 1 is a plan view of a semiconductor device according to an embodiment of the present invention, FIG. 2 is a cross-sectional view taken along line A-A of FIG. 1, FIG. 3 is a cross-sectional view taken along line B-B of FIG. 1, FIG. 4 is a cross-sectional view taken along line C-C of FIG. 1, FIG. 5 is a diagram illustrating the flow of current in a semiconductor device according to an embodiment of the present invention, FIG. 6 is a diagram for explaining an arrangement relationship between a pad and a connection electrode, FIG. 7 is a diagram for explaining a reflective layer of a semiconductor device, FIG. 8 is a diagram for explaining an intermediate layer between first and second light-emitting portions, FIG. 9 illustrates a modified example of FIG. 1, FIG. 10 is a plan view of a semiconductor device according to another embodiment of the present invention, FIG. 11 is a plan view of a semiconductor device according to another embodiment of the present invention, and FIG. 12 is a plan view of a semiconductor device according to another embodiment of the present invention.

DETAILED DESCRIPTION OF THE EMBODIMENTS

Embodiments may be embodied in many different forms or implemented in various combinations, and the scope of the present invention is not limited to embodiments described below.

Although matters described in a certain embodiment are not described in another embodiment, the matters may be understood in relation to the other embodiment unless described otherwise or contradictory to the matters.

For example, when features of a configuration A are described in a certain embodiment and features of a configuration B are described in another embodiment, it is to be understood that they fall within the scope of the present invention unless described otherwise or contradictory to the description, even when an embodiment in which the configuration A and the configuration B are combined is not explicitly described.

When one element is referred to as being formed "on" or "under" another element in embodiments, it will be understood that the two elements are formed to be in direct contact with each other or to be in indirect contact with each other while one or more elements are interposed therebetween. The expression "on" or "under" one element should be understood to mean not only an upward direction but also a downward direction with respect to the element.

Hereinafter, embodiments of the present invention will be described in detail with reference to the accompanying drawings so that they may be easily implemented by those of ordinary skill in the technical field to which the present invention pertains.

FIG. 1 is a plan view of a semiconductor device according to an embodiment of the present invention. FIG. 2 is a cross-sectional view taken along line A-A of FIG. 1. FIG. 3 is a cross-sectional view taken along line B-B of FIG. 1. FIG. 4 is a cross-sectional view taken along line C-C of FIG. 1.

Referring to FIG. 1, the semiconductor device according to an embodiment includes light-emitting structures 120-1 and 120-2 which include a plurality of first light-emitting portions 120-1 and a plurality of second light-emitting portions 120-2, a plurality of first connection electrodes 150 electrically connecting the plurality of first light-emitting portions 120-1, a plurality of second connection electrodes 170 electrically connecting the plurality of second light-emitting portions 120-2, a first pad 191 disposed on the plurality of first light-emitting portions 120-1, and a second pad 192 disposed on the plurality of second light-emitting portions 120-2.

The light-emitting structures 120-1 and 120-2 may include the plurality of first light-emitting portions 120-1 and the plurality of second light-emitting portions 120-2 which are spaced apart from each other at one side. The plurality of first light-emitting portions 120-1 and the plurality of second light-emitting portions 120-2 may be light-emitting cells isolated by etching. These light-emitting portions may be defined as regions independently having an active layer.

The plurality of first light-emitting portions 120-1 and the plurality of second light-emitting portions 120-2 may be spaced apart from each other in a second direction (a Y-axis direction) with respect to a first separation section d1. The plurality of first light-emitting portions 120-1 and the plurality of second light-emitting portions 120-2 may be spaced apart from each other in a first direction (an X-axis direction). The first direction (the X-axis direction) and the second direction (the Y-axis direction) are respectively defined as a horizontal direction and a vertical direction but are not limited thereto.

The number of the first light-emitting portions 120-1 may be greater than the number of the second light-emitting portions 120-2. The sum of the number of the first light-emitting portions 120-1 and the number of the second light-emitting portions 120-2 may be an odd number. For example, the number of the first light-emitting portions 120-1 may be four, the number of the second light-emitting portions 120-2 may be three, and thus the total number of the light-emitting portions may be seven, but embodiments are not limited thereto. For example, the number of the first light-emitting portions 120-1 may be five and the number of the second light-emitting portions 120-2 may be four. Alternatively, the number of the second light-emitting portions 120-2 may be greater than the number of the first light-emitting portions 120-1.

The first connection electrode 150 may electrically connect adjacent first light-emitting portions 120-1. The first connection electrodes 150 may connect the plurality of first light-emitting portions 120-1 in series.

The first connection electrode 150 may include a 1-1 connection electrode 151 on one of the first light-emitting portions 120-1, and a 1-2 connection electrode 151 extending to an adjacent first light-emitting portion 120-1. The 1-1 connection electrode 151 may be defined as a region extending in the vertical direction, and the 1-2 connection electrode 152 may be defined as a region extending in the horizontal direction. Alternatively, the 1-2 connection electrode 152 may be a region on a second separation section d2, by which adjacent first light-emitting portions 120-1 are spaced apart from each other.

The 1-1 connection electrode 151 may be arranged to overlap a plurality of second holes H2, and the 1-2 connection electrode 152 may be arranged to overlap a third hole H3.

The second connection electrodes 170 may electrically connect the plurality of second light-emitting portions 120-2. The second connection electrodes 170 may connect the plurality of second light-emitting portions 120-2 in series.

The second connection electrode 170 may include a 2-1 connection electrode 171 disposed on one of the plurality of second light-emitting portions 120-2, and a 2-2 connection electrode 172 extending to an adjacent second light-emitting portion 120-2.

The 2-1 connection electrode 171 may be defined as a region extending in the vertical direction, and the 2-2 connection electrode 172 may be defined as a region extending in the horizontal direction. Alternatively, the 2-2 connection electrode 172 may be a region on a third separation section d3 by which adjacent second light-emitting portions 120-2 are spaced apart from each other.

The 2-1 connection electrode 171 may be arranged to overlap a plurality of fifth holes H5, and the 2-2 connection electrode 172 may be arranged to overlap a sixth hole H6.

The third connection electrode 160 may electrically connect one of the plurality of first light-emitting portions 120-1 and one of the plurality of second light-emitting portions 120-2. The third connection electrode 160 may be disposed on the first separation section d1 to electrically connect the first light-emitting portion 120-1 and the second light-emitting portion 120-2.

A fourth connection electrode 180 may be disposed on the last second light-emitting portion 120-2 to be electrically connected to the second pad 192. That is, the fourth connection electrode 180 may not be an electrode electrically connecting light-emitting portions but may be a dummy electrode connecting a light-emitting portion and a pad.

The first pad 191 includes a 1-1 pad 191a extending in the horizontal direction and disposed on the plurality of first light-emitting portions 120-1, and a plurality of 1-2 pads 191b extending from the 1-1 pad 191a toward the second pad 192. The 1-1 connection electrode 151 may be disposed on a plane between adjacent 1-2 pads 191b. That is, the first connection electrode 150 may include a region on a plane between the 1-2 pads 191b in a thickness direction of the light-emitting structures 120-1 and 120-2.

The second pad 192 may include a 2-1 pad 192a extending in the horizontal direction and disposed on the plurality of second light-emitting portions 120-2, and a plurality of 2-2 pad 192b extending from the 2-1 pad 192a toward the first pad 191. The 2-1 connection electrode 171 may be disposed on a plane between adjacent 2-2 pads 192b. That is, the second connection electrode 170 may include a region between the plurality of 2-2 pads 192b in the thickness direction of the light-emitting structures 120-1 and 120-2.

In an embodiment, the first pad 191 may be arranged so as to not overlap the first connection electrode 150 in the thickness direction (the Z-axis direction) of the light-emitting structures 120-1 and 120-2, and the second pad 192 may be arranged so as to not overlap the second connection electrode 170 in the width direction.

In a case in which the first pad 191 and the first connection electrode 150 overlap, when cracks occur in an insulating layer therebetween, a current to be injected into a corresponding light-emitting portion leaks and thus light may not be emitted from the light-emitting portion. In particular, in a case of a light-emitting device to which a high voltage is applied, cracks are more likely to occur in the insulating layer. However, according to an embodiment, even when cracks occur in the insulating layer, current may be prevented from leaking because the first pad 191 and the first connection electrode 150 do not overlap. Therefore, current may be effectively suppressed from leaking even in a light-emitting device to which a high voltage and/or a high current is applied and which is likely to be thermally shocked.

Referring to FIG. 2, a first conductivity type semiconductor layer 121 may include a compound semiconductor such as Group-V or -VI compound semiconductor and may be doped with a first dopant. The first conductivity type semiconductor layer 121 may be formed of a semiconductor material having an empirical formula of $In_{x1}Al_{y1}Ga_{1-x1-y1}N(0\leq x1\leq 1, 0\leq y1\leq 1, 0\leq x1+y1\leq 1)$, e.g., a material selected from among GaN, AlGaN, InGaN, InAlGaN, etc. The first dopant may be an n-type dopant such as Si, Ge, Sn, Se, or Te. When the first dopant is the n-type dopant, the first conductivity type semiconductor layer 121 doped with the first dopant may be an n-type semiconductor layer.

An active layer 122 may be disposed between the first conductivity type semiconductor layer 121 and a second conductivity type semiconductor layer 123. The active layer 122 is a layer in which electrons (or holes) injected via the first conductivity type semiconductor layer 121 and holes (or electrons) injected via the second conductivity type semiconductor layer 123 meet. The active layer 122 changes to a low energy level due to recombination of electrons and holes, and light having an ultraviolet wavelength may be generated thereby.

The active layer 122 may include a well layer and a barrier layer and may have one of a single well structure, a multi-well structure, a single quantum well structure, a multi-quantum well (MQW) structure, a quantum dot structure, and a proton beam structure. However, the structure of the active layer 122 is not limited thereto.

The second conductivity type semiconductor layer 123 may be formed on the active layer 122, embodied as a Group-V or -VI compound semiconductor, and doped with a second dopant. The second conductivity type semiconductor layer 123 may be formed of a semiconductor material having an empirical formula of $In_{x5}Al_{y2}Ga_{1-x5-y2}N$ ($0 \leq x5 \leq 1$, $0 \leq y2 \leq 1$, $0 \leq x5+y2 \leq 1$) or a material selected from among AlInN, AlGaAs, GaP, GaAs, GaAsP, and AlGaInP. When the second dopant is a p-type dopant such as Mg, Zn, Ca, Sr, or Ba, the second conductivity type semiconductor layer 123 doped with the second dopant may be a p-type semiconductor layer.

A second electrode 130 disposed on the second conductivity type semiconductor layer 123 may include an ohmic electrode and/or a reflective electrode. The second electrode 130 may include, but is not limited to, at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, or Hf.

A first insulating layer 141 may be disposed between the light-emitting structures 120-1 and 120-2 and the first connection electrode 150. A second insulating layer 142 may be disposed between the first connection electrode 150 and the first pad 191. The first insulating layer 141 and the second insulating layer 142 may be formed of, but are not limited to, at least one material selected from the group consisting of SiO2, SixOy, Si3N4, SixNy, SiOxNy, Al2O3, TiO2, AlN, etc.

Each of the first insulating layer 141 and the second insulating layer 142 may be formed in a single layer or multiple layers. For example, each of the first insulating layer 141 and the second insulating layer 142 may be a distributed Bragg reflector (DBR) having a multi-layer structure including Ag, Si oxide, or Ti compound. However, embodiments are not limited thereto, and the first insulating layer 141 may include various types of reflective structures.

When the first insulating layer 141 performs a reflective function, light emitted from the active layer 122 may be reflected to improve light extraction efficiency. However, embodiments are not limited thereto and a reflective layer may be further provided.

The first pad 191 may be brought into contact with the second electrode 130 via the first hole H1 formed in the second insulating layer 142. Thus, the first pad 191 may be electrically connected to the second conductivity type semiconductor layer 123 of the first light-emitting portion 120-1.

A dummy electrode 153 may be additionally disposed between the first pad 191 and the second electrode 130. The dummy electrode 153 may block solders on the first pad 191 from being diffused to the first light-emitting portions 120-1. However, embodiments are not limited thereto and the dummy electrode 153 may be omitted. The dummy electrode may be formed simultaneously with the formation of the first connection electrode 150.

The first connection electrode 150 may be electrically connected to the first conductivity type semiconductor layer 121 via the second hole H2. Accordingly, current injected via the first pad 191 may flow to the connection electrode 150 via the first light-emitting portions 120-1.

The first connection electrode 150 may extend to the second separation section d2 so that the first connection electrode 150 may extend to an adjacent first light-emitting portion 120-1. The second separation section d2 may be a section in which the plurality of first light-emitting portion 120-1 are isolated from each other. The first connection electrode 150 extending to the adjacent first light-emitting portion 120-1 may be connected to the second electrode 130 of the first light-emitting portion 120-1 and the second conductivity type semiconductor layer 123 adjacent thereto via the third hole H3. Thus, the first connection electrode 150 may connect adjacent first light-emitting portions 120-1 in series.

Referring to FIGS. 1 and 3, the third connection electrode 160 may electrically connect one of the plurality of first light-emitting portions 120-1 and one of the plurality of second light-emitting portions 120-2. The third connection electrode 160 may be disposed on the first separation section d1 extending in the horizontal direction. In detail, the third connection electrode 160 may be electrically connected to the first conductivity type semiconductor layer 121 of the first light-emitting portion 120-1 via the second hole H2 and electrically connected to the second conductivity type semiconductor layer 123 of the second light-emitting portion 120-2 via the fourth hole H4.

Referring to FIGS. 1 and 4, the second connection electrode 170 may extend to an adjacent second light-emitting portion 120-2 and may be electrically connected to the adjacent second light-emitting portion 120-2 via the sixth hole H6. The second connection electrode 170 may connect adjacent light-emitting portions 120-2 in series via the fifth hole H5 and the sixth hole H6.

The fourth connection electrode 180 may be disposed on the last second light-emitting portion 120-2. The fourth connection electrode 180 may be electrically connected to the second light-emitting portion 120-2 via the fifth hole H5 and electrically connected to the second pad 192 via a seventh hole H7. Accordingly, when current is injected via the first pad 191 and the second pad 192, the current may flow in one direction. The direction in which the current (or electric charges) moves may be determined by the polarity of power supplied to the first and second pads 191 and 192.

FIG. 5 is a diagram illustrating the flow of current in a semiconductor device according to an embodiment of the present invention. FIG. 6 is a diagram for explaining the arrangement relationship between a pad and a connection electrode.

As described above, current injected via the first pad 191 may be injected to the first light-emitting portion 120-1 and then flow to the adjacent first light-emitting portion 120-1 through the first connection electrode 150. Thereafter, current injected into the second light-emitting portion 120-2 through the third connection electrode 160 continuously flows to an adjacent second light-emitting portion 120-2 through the second connection electrode 170.

As described above, current may be injected to a light-emitting portion through a connection electrode, distributed, and then flow to an adjacent connection electrode. The flow of current in the first and second light-emitting portions 120-1 and 120-2 is indicated by dotted arrows, and the flow of current in the first to third connection electrodes 150, 160 and 170 is indicated by solid arrows.

In this case, a direction N1 in which current flows in the plurality of 1-2 connection electrodes 152 and a direction N2 in which current flows in the plurality of 2-2 connection electrodes 172 may be opposite to each other. For example, the direction N1 in which current flows in the plurality of 1-2 connection electrodes 152 may be a left-to-right direction (an X1-axis direction) in the drawing, and the direction N2 in which current flows in the plurality of 2-2 connection electrodes 172 may be a right-to-left direction (an X2-axis direction).

Because the first light-emitting portion 120-1 and the second light-emitting portion 120-2 are electrically connected by the third connection electrode 160, the 1-2 connection electrode 152, the third connection electrode 160, and the 2-2 connection electrode 172 may have a U-shape (the X1-axis direction, the Y2-axis direction, and X2-axis direction). Therefore, a direction in which current sequentially flows through the 1-2 connection electrode 152, the third connection electrode 160, and the 2-2 connection electrode 172 may have the U-shape.

The number of the first light-emitting portions 120-1 may be greater than the number of the second light-emitting portions 120-2. A ratio between the sum of areas of the first light-emitting portions 120-1 and the sum of areas of the second light-emitting portions 120-2 may be in a range of 1:0.8 to 1:1.2. That is, the first light-emitting portions 120-1 and the second light-emitting portions 120-2 may be manufactured to have substantially the same area. Therefore, the densities of current injected into these light-emitting portions are substantially the same and thus uniform light emission may be achieved.

The first separation section d1 may not coincide with a first imaginary line C1 extending in the horizontal direction and bisecting the semiconductor device. The first separation section d1 may be provided lower than the first imaginary line C1. The first imaginary line C1 and a second imaginary line C2 may not coincide with each other. The second imaginary line C2 may be an imaginary straight line bisecting the first separation section d1 in the horizontal direction. Therefore, the first imaginary line C1 may be provided on the first light-emitting portions 120-1.

When the first imaginary line C1 and the second imaginary line C2 coincide with each other, an upper region and a lower region of the semiconductor device have substantially the same area. In this case, the area of the first light-emitting portions 120-1 dividing the upper region into four equal parts may be smaller than that of the second light-emitting portions 120-2 dividing the lower region into three equal parts. Accordingly, the first light-emitting portions 120-1 and the second light-emitting portions 120-2 are different from each other in terms of current density and thus uniform light emission may be difficult to achieve.

The 1-2 connection electrode 152 and the 2-2 connection electrode 172 may be disposed in a first region d19 which is wider than the first separation section d1. The first region d19 may include the first separation section d1.

The first region d19 may be a minimum region which extends from the first separation section d1 in the vertical direction and includes the 1-2 connection electrode 152 and the 2-2 connection electrode 172. Thus, an upper line of the first region d19 may coincide with an upper end of the 1-2 connection electrode 152, and a lower line thereof may coincide with a lower end of the 2-2 connection electrode 172.

The first region d19 may be provided with the third hole H3 connecting the 1-2 connection electrode 152 and the second conductivity type semiconductor layer of the first light-emitting portion 120-1, and the sixth hole H6 connecting the 2-2 connection electrode 172 and the second conductivity type semiconductor layer of the second light-emitting portion 120-2.

A ratio d9:d19 between a vertical width d9 of the semiconductor device and a width of the first region d19 may be in a range of 1:0.25 to 1:0.5. When the ratio d9:d19 is greater than 1:0.25 (e.g., the ratio d9:d19 is 1:0.2), the widths of the 1-2 connection electrode 152 and the 2-2 connection electrode 172 decrease and thus these electrodes may be broken due to the concentration of current. When the ratio d9:d19 is less than 1:0.5, the widths of the 1-2 connection electrodes 152 and the 2-2 connection electrode 172 increase and thus the areas of the first and second pads 191 and 192 may relatively decrease. Therefore, soldering reliability may decrease.

Referring to FIG. 6, the area of the first pad 191 may be greater than that of the second pad 192. A ratio between a total area of the first pad 191 and a total area of the second pad 192 may be in a range of 1:0.6 to 1:0.9. When this ratio is greater than 1:0.6, the area of the second pad 192 is excessively small and thus soldering reliability of the second pad 192 may decrease. In addition, when this ratio is less than 1:0.9, the width of the 2-2 connection electrode 172 may decrease. In order to increase the area of the second pad 192, the second pad 192 should be enlarged in the vertical direction and thus the width of the 2-2 connection electrode 172 may decrease. Therefore, the 2-2 connection electrode 172 may be broken when the high voltage is applied thereto.

A vertical width d23 of the 1-2 pad 191b may be greater than a vertical width d22 of the 1-1 pad 191a. A horizontal width d20 of the 1-2 pad 192b between the 1-1 connection electrodes 151 may be greater than a vertical width d22 of the 1-1 pad 191a.

A vertical width d24 of the 2-2 pad 192b may be greater than a vertical width d25 of the 2-1 pad 192a. A horizontal width d21 of the 2-2 pad 192b between the 2-1 connection electrodes 171 may be greater than a vertical width d25 of the 2-1 pad 192a.

The horizontal width d21 of the 2-2 pad 192b may be greater than the horizontal width d20 of the 1-2 pad 191b. For example, a ratio d20:d21 between the horizontal width d20 of the 1-2 pad 191b and the horizontal width d21 of the 2-2 pad 192b may be in a range of 1:1.2 to 1:1.7. When this ratio is greater than 1:1.2 (e.g., when the ratio is 1:1), the area of the second pad 192 decreases and thus soldering may be difficult to perform. When the ratio is less than 1:1.7, the width of the 1-1 pad 191a increases and thus the width of the 1-1 connection electrode 151 may decrease. Therefore, the 1-1 connection electrode 151 may be broken when current is concentrated. A vertical width d23 of the 1-2 pad 191b may be greater than a vertical width d24 of the 2-2 pad 192b.

A ratio d13:d15 between a vertical width d13 of the first light-emitting portion 120-1 and a vertical width d15 of the 1-2 connection electrode 152 may be in a range of 1:0.15 to 1:0.35. When this ratio is greater than 1:0.15, the width of the 1-2 connection electrode 152 decreases and thus may be broken due to the concentration of current. When this ratio is less than 1:0.35, the area of the first pad 191 is relatively small and thus soldering reliability may decrease. For the same reason, a ratio between a vertical width d14 of the first pad 191 and a vertical width d15 of the 1-2 connection electrode 152 should satisfy a range of 1:0.25 to 1:0.4.

A ratio between a vertical width d16 of the second light-emitting portion 120-2 and a vertical width d17 of the 2-2 connection electrode 172 may be in a range of 1:0.1 to 1:0.3. When this ratio is greater than 1:0.1, the width of the 2-2 connection electrode 172 decreases and thus may be broken due to the concentration of current. When this ratio is less than 1:0.3, the area of the second pad 192 decreases and thus soldering reliability may decrease. For the same reason, a ratio between a vertical width d18 of the second pad 192 and a vertical width d17 of the 2-2 connection electrode 172 should satisfy a range of 1:0.2 to 1:0.35.

A ratio d15:d17 between the vertical width d15 of the 1-2 connection electrode 152 and a vertical width d17 of the 2-2 connection electrode 172 may be in a range of 1:0.4 to 1:0.7. When the width ratio is greater than 1:0.4, the width of the 2-2 connection electrode 172 decreases and thus current may be concentrated thereon. When the width ratio is less than 1:0.7, the width of the 2-2 connection electrode 172 increases and thus the area of the second pad 192 may relatively decrease. Thus, soldering reliability of the second pad 192 may decrease.

A ratio d6:d12 of horizontal widths of the first light-emitting portion 120-1 and the second light-emitting portion 120-2 may be in a range of 1:1.1 to 1:1.5. A ratio d13:d16 of the vertical widths of the first light-emitting portion 120-1 and the second light-emitting portion 120-2 may be in a range of 1:0.6 to 1:0.9. That is, the width of the first light-emitting portion 120-1 may be greater that of the second light-emitting portion 120-2 in the horizontal direction, and the width of the second light-emitting portion 120-2 may be greater that of the first light-emitting portion 120-1 in the vertical direction. That is, the first light-emitting portion 120-1 and the second light-emitting portion 120-2 may have substantially the same area.

The 1-1 connection electrode 151 may include a second region S31 between the plurality of 1-2 pads 191b. The second region S31 may be a region overlapping the first connection electrode 150 when the first pad 191 is formed in a tetragonal shape.

A ratio between the sum of the areas of second regions S31 and the area of the first pad 191 may be in a range of 1:0.2 to 1:0.4. When the area ratio is greater than 1:0.2, the area of the 1-1 connection electrode 151 decreases and thus the 1-1 connection electrode 151 may be broken due to the concentration of current. In addition, when the area ratio is less than 1:0.4, the area of the first pad 191 decreases and thus soldering reliability may decrease.

The 1-2 connection electrode 171 may include a third region d32 between the plurality of 2-2 pads 192b. In this case, a ratio between the sum of the areas of third regions S32 and the area of the second pad 192 may satisfy a range of 1:0.2 to 1:0.4 for the same reason as described above.

FIG. 7 is a diagram for explaining a reflective layer of a semiconductor device. FIG. 8 is a diagram for explaining an intermediate layer between first and second light-emitting portions. FIG. 9 illustrates a modified example of FIG. 1.

Referring to FIG. 7, a reflective layer 143 may be further disposed on the first insulating layer 141. The reflective layer 143 may be a distributed Bragg reflector (DBR) having a multi-layer structure including Ag, Si oxide, or Ti compound. However, the reflective layer 143 is not limited thereto and may include various types of reflective structures. For example, the reflective layer 143 may be formed by repeatedly stacking a high-refractive index layer and a low-refractive index layer but is not limited thereto. The reflective layer 143 may reflect light emitted from the active layer 122 to improve light extraction efficiency.

Referring to FIG. 8, an intermediate layer 144 may be disposed between the plurality of first and second light-emitting portions 120-1 and 120-2. The intermediate layer 144 may have a thickness equal to a height to which the first and second light-emitting portions 120-1 and 120-2 or the first insulating layer 141 protrudes. For example, the intermediate layer 144 may be a planarization layer.

The first to third connection electrodes 150, 160, and 170 may be disposed on the first separation section d1, the second separation section d2, and the third separation section d3, respectively. FIG. 8 illustrates an example in which the second connection electrode 160 is arranged on the second separation section d2.

Because the first and second light-emitting portions 120-1 and 120-2 protrude, it may be difficult to form the first to third connection electrodes 150, 160 and 170 to a uniform thickness on the first and second light-emitting portions 120-1 and 120-2. However, according to an embodiment, the first to third connection electrodes 150, 160, and 170 are disposed on the intermediate layer 144 and thus may be easily formed to a uniform thickness. Therefore, low-current characteristics and reliability may be improved.

A material of the intermediate layer 144 is not particularly limited. The intermediate layer 144 may include the same material as the first insulating layer 141. For example, the intermediate layer 144 may include, but is not limited to, $SiO_2$, $Si_3N_4$, resin, spin-on-glass (SOG), or a spin-on-dielectric (SOD).

Referring to FIG. 9, the first pad 191 may include sub-pads 191c, each of which is disposed on one of the plurality of first light-emitting portions 120-1. The first sub-pads 191c may be spaced apart from each other. Similarly, the second pad 192 may include second sub-pads 192c, each of which is disposed on one of the plurality of second light-emitting portions 120-2. Due to the above configuration, a degree of freedom of a pad design may be improved.

A ratio between the area of the first light-emitting portions 120-1 and the area of the first sub-pads 191c may be in a range of 1:0.2 to 1:0.4. When the area ratio is greater than 1:0.2, the area of the first sub-pads 191c decreases and thus soldering reliability may decrease. When the area ratio is less than 1:0.4, the area of the first sub-pads 191c increases and thus the area of the first connection electrode 150 may relatively decreases. Therefore, the first connection electrode 150 may be broken when high voltage is applied thereto. A ratio between the area of the second light-emitting portions 120-2 and the area of the second sub-pads 192c may also satisfy a range of 1:0.2 to 1:0.4 for the same reason.

FIG. 10 is a plan view of a semiconductor device according to another embodiment of the present invention.

Referring to FIG. 10, the semiconductor device according to the embodiment includes a plurality of first light-emitting portions 120-1 disposed at a side and a plurality of second light-emitting portions 120-2 disposed at another side.

The number of the first light-emitting portions 120-1 and the number of the second light-emitting portions 120-2 may be the same. The total number of the first light-emitting portions 120-1 and the second light-emitting portions 120-2 may be an even number. An example in which the number of the first light-emitting portions 120-1 and the number of the second light-emitting portions 20-2 are each four is illustrated but embodiments are not limited thereto.

A first separation section d1 may be provided between the first light-emitting portions 120-1 and the second light-emitting portions 120-2. The first light-emitting portions 120-1 and the second light-emitting portions 120-2 may be spaced apart from each other in the vertical direction with respect to the first separation section d1. For example, the plurality of first light-emitting portions 120-1 and the plurality of second light-emitting portions 120-2 may be disposed may be disposed on an upper side of the semiconductor device. In one embodiment, because the number of the first light-emitting portions 120-1 and the number of the second light-emitting portions 120-2 are the same, the first separation section d1 may coincide with an imaginary line bisecting the semiconductor device. That is, the areas of an upper region and a lower region of the semiconductor device may be the same with respect to the first separation section d1.

Accordingly, the areas of a first pad 191 and a second pad 192 may be the same, and the shapes of a first connection electrode 150 and a second connection electrode 170 may be substantially the same.

FIG. 11 is a plan view of a semiconductor device according to another embodiment of the present invention. FIG. 12 is a plan view of a semiconductor device according to another embodiment of the present invention.

The specific configurations of the first light-emitting portions 120-1, the second light-emitting portions 120-2, the first connection electrode 150, and the second connection electrode 170 described above with reference to FIG. 1 may also apply to FIG. 11. However, a first pad 191 may overlap a first connection electrode 150 in a thickness direction, and a second pad 192 may overlap a second connection electrode 170 in the thickness direction. Due to the above structure, the first pad 191 and the second pad 192 may be freely designed, and an area required for soldering may be secured.

A ratio between an area of the first pad 191 and an overlapping area 51 may be in a range of 1:0.2 to 1:0.4. The overlapping area 51 may be an area in which the first pad 191 and the first connection electrode 150 overlap in the thickness direction. When the area ratio is greater than 1:0.2, the area of the first connection electrode 150 decreases and thus the first connection electrode 150 may be broken due to the concentration of current. When the area ratio is less than 1:0.4, an overlapping area increases and current may leak when an insulating layer is broken. For the same reason, a ratio between an area of the second pad 192 and an overlapping area S2 may be in a range of 1:0.2 to 1:0.4. The overlapping area S2 may be a total area in which the second pad 192 and second and fourth connection electrodes 170 and 180 overlap in the thickness direction.

The number of the first light-emitting portions 120-1 may be greater than the number of the second light-emitting portions 120-2. A ratio between the sum of areas of the first light-emitting portions 120-1 and the sum of areas of the second light-emitting portions 120-2 may be in a range of 1:0.8 to 1:1.2. That is, the first light-emitting portions 120-1 and the second light-emitting portions 120-2 may be manufactured to have substantially the same area. Therefore, the densities of current injected into these light-emitting portions are substantially the same and thus uniform light emission may be achieved.

A first separation section d1 may not coincide with a first imaginary line C1 extending in the horizontal direction and bisecting the semiconductor device. The first separation section d1 may be provided lower than the first imaginary line C1. The first imaginary line C1 and a second imaginary line C2 may not coincide with each other. The second imaginary line C2 may be an imaginary straight line bisecting the first separation section d1 in the horizontal direction.

When the first imaginary line C1 and the second imaginary line C2 coincide with each other, an upper region and a lower region of the semiconductor device have substantially the same area. Thus, the area of the first light-emitting portions 120-1 dividing the upper region into four equal parts may be smaller than that of the second light-emitting portions 120-2 dividing the lower region into three equal parts. Accordingly, the first light-emitting portions 120-1 and the second light-emitting portions 120-2 are different from each other in terms of current density and thus uniform light emission may be difficult to achieve.

A 1-2 connection electrode 152 and a 2-2 connection electrode 172 may be disposed in a first region d19 which is wider than the first separation section d1. In this case, a third imaginary line extending in the horizontal direction and bisecting the first region d19 may coincide with the second imaginary line C2 bisecting the first separation section d1.

A ratio d9:d19 between a width of the semiconductor device and a width of the first region d19 may be in a range of 1:0.25 to 1:0.5. When the ratio d9:d19 is greater than 1:0.25 (e.g., the ratio d9:d19 is 1:0.2), the widths of the 1-2 connection electrode 152 and the 2-2 connection electrode 172 decrease and thus these electrodes may be broken due to the concentration of current. When the ratio d9:d19 is less than 1:0.5, the widths of the 1-2 connection electrodes 152 and the 2-2 connection electrode 172 increase and thus the areas of the first and second pads 191 and 192 may relatively decrease. Therefore, soldering reliability may decrease.

Referring to FIG. 12, the number of first light-emitting portions 120-1 and the number of the second light-emitting portions 120-2 may be the same. A total number of the first light-emitting portions 120-1 and the second light-emitting portions 120-2 may be an even number. An example in which the number of the first light-emitting portions 120-1 and the number of the second light-emitting portions 20-2 are each four is illustrated.

A first separation section d1 may be provided between the first light-emitting portions 120-1 and the second light-emitting portions 120-2. The first light-emitting portions 120-1 and the second light-emitting portions 120-2 may be spaced apart from each other in the vertical direction with respect to the first separation section d1. For example, the plurality of first light-emitting portions 120-1 and the plurality of second light-emitting portions 120-2 may be disposed on an upper side of the semiconductor device. In one embodiment, because the number of the first light-emitting portions 120-1 and the number of the second light-emitting portions 120-2 are the same, the first separation section d1 may coincide with an imaginary line bisecting the semiconductor device. That is, the areas of an upper region and a lower region of the semiconductor device may be the same with respect to the first separation section d1.

Accordingly, the areas of a first pad 191 and a second pad 192 may be the same, and the shapes of a first connection electrode 150 and a second connection electrode 170 may be substantially the same.

Semiconductor devices may be used as light sources of illumination systems or as light sources of image display devices or illumination devices. That is, semiconductor devices are applicable to various electronic devices arranged in a case to provide light. For example, when a semiconductor device and an RGB phosphor are mixedly used, white light with excellent color rendering index (CRI) may be realized.

The above-described semiconductor device may be configured as a light-emitting device package and used as a light source of an illumination system and may be used, for example, as a light source of an image display device or an illumination device.

A semiconductor device is available as an edge type backlight unit or a direct-type backlight unit when used as a backlight unit of an image display device, is available as a light fixture or a bulb type device when used as a light source of an illumination device, or is available as a light source of a mobile terminal.

The light-emitting element includes a laser diode, as well as the light-emitting diode described above.

The laser diode may include a first conductivity type semiconductor layer, an active layer, and a second conductivity type semiconductor layer as described above, similar to the light-emitting element. The laser diode uses the electro-luminescence phenomenon that light is emitted when current is supplied after bonding a p-type first conductivity type semiconductor and an n-type second conductivity type semiconductor but is different from the light-emitting element in terms of the directivity and phase of emitted light. That is, the laser diode may emit light having one specific wavelength (monochromatic beam) to have the same phase in the same direction using the stimulated emission phenomenon and the constructive interference phenomenon. Due to the above characteristics, the laser diode is available to optical communication, medical equipment and semiconductor processing equipment.

Examples of the light-receiving element include a photodetector which is a type of transducer that detects light and converts the intensity of the light into an electric signal. Examples of the photodetector may include, but are not limited to, a photocell (silicon, selenium), a photoconductive element (cadmium sulfide, cadmium selenide), a photodiode (e.g., a photodiode with a peak wavelength in a visible blind spectral region or a true blind spectral region), a phototransistor, a photomultiplier tube, a phototube (vacuum, gas-filled), an infra-red (IR) detector, and the like.

A semiconductor device such as a photodetector may be manufactured using a direct bandgap semiconductor which generally has high photo-conversion efficiency. The photodetector may have various configurations. As photodetectors having most general configurations, there are a pin type photodetector using a p-n junction, a Schottky photodetector using a Schottky junction, and a metal-semiconductor-metal (MSM) photodetector, etc.

The photodiode may include a first conductivity type semiconductor layer, an active layer, and a second conductivity type semiconductor layer as described above similar to the light-emitting device and may have a pn junction structure or a pin structure. The photodiode is operated by applying a reverse bias or a zero bias. When light is incident on the photodiode, electrons and holes are generated and thus current flows. In this case, the intensity of the current may be almost proportional to that of the light incident on the photodiode.

A photocell or a solar cell is a type of photodiode that converts light into current. The solar cell may include a first conductivity type semiconductor layer, an active layer, and a second conductivity type semiconductor layer as described above, similar to the light-emitting element.

In addition, the semiconductor device is applicable as a rectifier of an electronic circuit owing to rectifying characteristic of a general diode using a p-n junction, and is applicable to an oscillation circuit or the like when applied to a microwave circuit or the like.

The above-described semiconductor device is not necessarily formed of a semiconductor and may further include a metal material in some cases. For example, a semiconductor device such as a light-receiving element may be formed of at least one of Ag, Al, Au, In, Ga, N, Zn, Se, P, or As, or formed of a semiconductor material doped with a p- or n-type dopant or an intrinsic semiconductor material.

While exemplary embodiments have been particularly described above, the present invention is not limited thereto, and it will be apparent to those of ordinary skill in the art that various modifications and applications may be made without departing from the essential features of embodiments. For example, each of the components in the embodiments can be modified and implemented. It is to be understood that differences related to such modifications and applications fall within the scope of the present invention defined in the appended claims.

The invention claimed is:

1. A semiconductor device comprising:
   a light-emitting structure including a plurality of first light-emitting portions disposed at a side and a plurality of second light-emitting portions disposed at another side;
   a plurality of first connection electrodes configured to electrically connect the plurality of first light-emitting portions;
   a plurality of second connection electrodes configured to electrically connect the plurality of second light-emitting portions;
   a first pad disposed on the plurality of first light-emitting portions; and
   a second pad disposed on the plurality of second light-emitting portions,
   wherein the first pad comprises a plurality of 1-2 pads extending toward the second pad,
   the second pad comprises a plurality of 2-2 pads extending toward the first pad,
   each of the plurality of first connection electrodes comprises a region on a plane between the plurality of 1-2 pads, and
   each of the plurality of second connection electrodes comprises a region on a plane between the plurality of 2-2 pads,
   wherein the first pad does not overlap the plurality of first connection electrodes in a thickness direction of the light-emitting structure, and
   wherein the second pad does not overlap the plurality of second connection electrodes in the thickness direction.

2. The semiconductor device of claim 1, wherein the plurality of first light-emitting portions are spaced apart from each other in a first direction,
   the plurality of second light-emitting portions are spaced apart from each other in the first direction, and
   the plurality of first light-emitting portions are spaced apart from the plurality of second light-emitting portions in a second direction perpendicular to the first direction.

3. The semiconductor device of claim 2, wherein the first pad further comprises:
   a 1-1 pad extending in the first direction and disposed on the plurality of first light-emitting portions, wherein each of the plurality of first connection electrodes comprises:
a 1-1 connection electrode disposed on a first light-emitting portion; and
a 1-2 connection electrode extending to another first light-emitting portion adjacent thereto.

4. The semiconductor device of claim 3, wherein the 1-1 connection electrode is disposed between adjacent 1-2 pads, and
a ratio between a width of the first light-emitting portion in the second direction and a width of the 1-2 connection electrode in the second direction is in a range of 1:0.15 to 1:0.35.

5. The semiconductor device of claim 3, wherein the second pad further comprises:
a 2-1 pad disposed on the plurality of second light-emitting portions;
wherein a width of each of the plurality of 2-2 pads in the first direction is greater than that of each of the plurality of 1-2 pads in the first direction, and
wherein a width of each of the plurality of 1-2 pads in the second direction is greater than that of each of the plurality of 2-2 pads in the second direction.

6. The semiconductor device of claim 4, wherein each of the plurality of second connection electrodes comprises:
a 2-1 connection electrode disposed on a second light-emitting portion; and
a 2-2 connection electrode extending to another second light-emitting portion adjacent thereto,
wherein a width of the 1-2 connection electrode is greater than that of the 2-2 connection electrode, and
wherein a ratio between the width of the 1-2 connection electrode and the width of the 2-2 connection electrode is in a range of 1:0.4 to 1:0.7.

7. The semiconductor device of claim 2, wherein the light-emitting structure comprises a pair of side surfaces parallel to the second direction, and
wherein a first imaginary line extending from a midpoint between the pair of side surfaces crosses the plurality of first light-emitting portions.

8. The semiconductor device of claim 1, wherein the number of the plurality of first light-emitting portions is greater than the number of the plurality of second light-emitting portions, and
a ratio between an area of each of the plurality of first light-emitting portions and an area of each of the plurality of second light-emitting portions is in a range of 1:0.8 to 1:1.2.

9. The semiconductor device of claim 1, further comprising:
a third connection electrode configured to electrically connect one of the plurality of first light-emitting portions and one of the plurality of second light-emitting portions; and
a fourth connection electrode configured to electrically connect the second pad and the plurality of second light-emitting portions.

10. The semiconductor device of claim 6, wherein a direction in which current flows through each of the plurality of 1-2 connection electrode and a direction in which current flows through each of the plurality of 2-2 connection electrode are opposite to each other.

11. A semiconductor device comprising:
a light-emitting structure including a plurality of first light-emitting portions disposed at a side and a plurality of second light-emitting portions disposed at another side;
a plurality of first connection electrodes configured to electrically connect the plurality of first light-emitting portions;
a plurality of second connection electrodes configured to electrically connect the plurality of second light-emitting portions;
a first pad disposed on the plurality of first light-emitting portions; and
a second pad disposed on the plurality of second light-emitting portions,
wherein the first pad does not overlap the plurality of first connection electrodes in a thickness direction of the light-emitting structure,
wherein the second pad does not overlap the plurality of second connection electrodes in the thickness direction,
wherein the plurality of first light-emitting portions is spaced apart from each other in a first direction,
wherein the plurality of second light-emitting portions is spaced apart from each other in the first direction,
wherein the first pad includes a 1-1 pad extending in the first direction and disposed on the plurality of first light-emitting portions, and a plurality of 1-2 pads extending toward the second pad, and
wherein each of the plurality of first connection electrodes includes a 1-1 connection electrode disposed between adjacent 1-2 pads on a first light-emitting portion.

12. The semiconductor device of claim 11,
wherein the plurality of first light-emitting portions is spaced apart from the plurality of second light-emitting portions in a second direction perpendicular to the first direction.

13. The semiconductor device of claim 11, wherein the each of plurality of first connection electrodes further includes a 1-2 connection electrode extending to another first light-emitting portion adjacent thereto.

14. The semiconductor device of claim 13, wherein a ratio between a width of the first light-emitting portion in the second direction and a width of the 1-2 connection electrode in the second direction is in a range of 1:0.15 to 1:0.35.

15. The semiconductor device of claim 11, wherein the second pad includes a 2-1 pad disposed on the plurality of second light-emitting portions, and a 2-2 pad extending from the 2-1 pad to the first pad.

16. The semiconductor device of claim 15, wherein a width of the 2-2 pad in the first direction is greater than that of each of the plurality of 1-2 pads in the first direction, and a width of each of the plurality of 1-2 pads in a second direction perpendicular to the first direction is greater than that of the 2-2 pad in the second direction.

17. The semiconductor device of claim 11, wherein each of the plurality of second connection electrodes includes a 2-1 connection electrode disposed on a second light-emitting portion, and a 2-2 connection electrode extending to another second light-emitting portion adjacent thereto.

18. The semiconductor device of claim 17, wherein a width of the 1-2 connection electrode is greater than that of the 2-2 connection electrode.

* * * * *